United States Patent
Wilson et al.

(10) Patent No.: US 11,226,141 B2
(45) Date of Patent: Jan. 18, 2022

(54) TWO-PHASE EXPENDABLE COOLING SYSTEMS WITH PASSIVE FLOW CONTROL MEMBRANES

(71) Applicant: Raytheon Company, Waltham, MA (US)

(72) Inventors: James S. Wilson, Hurst, TX (US); Alex E. Ockfen, Tucson, AZ (US); Adolfo Lozano, III, Dallas, TX (US); Amanda S. Rickman, Garland, TX (US)

(73) Assignee: Raytheon Company, Waltham, MA (US)

( * ) Notice: Subject to any disclaimer, the term of this patent is extended or adjusted under 35 U.S.C. 154(b) by 422 days.

(21) Appl. No.: 15/831,180

(22) Filed: Dec. 4, 2017

(65) Prior Publication Data

US 2019/0170406 A1 Jun. 6, 2019

(51) Int. Cl.
| | |
|---|---|
| *F25B 19/00* | (2006.01) |
| *H01L 23/427* | (2006.01) |
| *H05K 7/20* | (2006.01) |
| *F28F 13/00* | (2006.01) |
| *F25B 19/04* | (2006.01) |

(52) U.S. Cl.
CPC .............. *F25B 19/00* (2013.01); *F25B 19/04* (2013.01); *F28F 13/00* (2013.01); *H01L 23/427* (2013.01); *H05K 7/2039* (2013.01); *H05K 7/20327* (2013.01); *F25B 2321/0252* (2013.01); *F25B 2600/13* (2013.01)

(58) Field of Classification Search
CPC .......... F25B 19/00; F25B 19/04; F25B 30/00; F25B 2321/0252; F25B 2600/13; F28F 13/00; H01L 23/427; H05K 7/20327; H05K 7/2039
See application file for complete search history.

(56) References Cited

U.S. PATENT DOCUMENTS 2,925,722 A 2/1960 Blackburn et al.
4,302,793 A * 11/1981 Rohner .............. H05K 7/20272
174/15.1

(Continued)

OTHER PUBLICATIONS

International Search Report and Written Opinion of the International Searching Authority dated Nov. 6, 2018 in connection with International Patent Application No. PCT/US2018/047937, 11 pages.

*Primary Examiner* — Christopher R Zerphey

(57) ABSTRACT

An apparatus includes a heat sink configured to receive thermal energy from one or more heat sources. The heat sink includes a local reservoir configured to hold a liquid coolant, and the heat sink is configured to pass the thermal energy into the liquid coolant in the local reservoir in order to vaporize at least some of the liquid coolant. The apparatus also includes a membrane configured to allow vaporized coolant to pass through the membrane out of the local reservoir into an ambient environment and to prevent unvaporized coolant from passing through the membrane. The membrane is thereby configured to provide passive flow control for the liquid coolant. The membrane could include a vapor-permeable and liquid-repelling membrane. The membrane can also be configured to hold the liquid coolant in the local reservoir against one or more surfaces of the heat sink.

20 Claims, 7 Drawing Sheets

(56) References Cited

U.S. PATENT DOCUMENTS

| | | | |
|---|---|---|---|
| 5,570,150 A | 10/1996 | Yoneyama et al. | |
| 8,029,675 B2 | 10/2011 | Heinzl | |
| 9,687,943 B2 | 6/2017 | Campbell et al. | |
| 2004/0104012 A1* | 6/2004 | Zhou | H01L 23/427 165/104.26 |
| 2005/0286227 A1 | 12/2005 | Erturk et al. | |
| 2008/0043440 A1 | 2/2008 | Fedorov | |
| 2010/0314093 A1* | 12/2010 | Refai-Ahmed | F28D 15/0266 165/287 |
| 2013/0112377 A1 | 5/2013 | Yang et al. | |
| 2016/0295742 A1 | 10/2016 | Moghaddam et al. | |
| 2019/0390911 A1* | 12/2019 | Bunch | F28C 3/08 |

\* cited by examiner

TWO-PHASE EXPENDABLE COOLING SYSTEMS WITH PASSIVE FLOW CONTROL MEMBRANES

TECHNICAL FIELD

This disclosure generally relates to cooling systems. More specifically, this disclosure relates to two-phase expendable cooling systems with passive flow control membranes.

BACKGROUND

Cooling systems are used in numerous devices and systems to cool components of those devices and systems. For example, electronic devices and systems routinely include cooling subsystems that are used to cool processors or other electrical components. The ability to effectively cool components of a device or system can have a large impact on the ability of the device or system to function properly, and improper or ineffective cooling can significantly shorten the operational lifespan of the device or system.

Some conventional cooling systems are known as "two-phase" cooling systems since they use liquid (such as methanol) that is converted into vapor (such as through boiling or evaporation) in order to remove thermal energy from components. For example, a liquid can be sprayed onto a surface to be cooled, sprayed onto a wicking surface that spreads the liquid on a surface to be cooled, or gravity-fed to a surface to be cooled. The liquid then absorbs thermal energy and is converted into vapor. Some two-phase cooling systems represent "expendable" or "open-loop" cooling systems in that the vapor is not retained and is allowed to escape into an ambient environment. This helps to avoid the use of heat exchangers or other structures to convert the vapor back into liquid and can be useful in cooling scenarios that have finite time durations.

SUMMARY

This disclosure provides two-phase expendable cooling systems with passive flow control membranes.

In a first embodiment, an apparatus includes a heat sink configured to receive thermal energy from one or more heat sources. The heat sink includes a local reservoir configured to hold a liquid coolant, and the heat sink is configured to pass the thermal energy into the liquid coolant in the local reservoir in order to vaporize at least some of the liquid coolant. The apparatus also includes a membrane configured to allow vaporized coolant to pass through the membrane out of the local reservoir into an ambient environment and to prevent unvaporized coolant from passing through the membrane. The membrane is thereby configured to provide passive flow control for the liquid coolant.

In a second embodiment, a system includes one or more heat sources configured to generate or receive thermal energy and a cooling system. The cooling system includes a heat sink configured to receive the thermal energy from the one or more heat sources. The heat sink includes a local reservoir configured to hold a liquid coolant, and the heat sink is configured to pass the thermal energy into the liquid coolant in the local reservoir in order to vaporize at least some of the liquid coolant. The cooling system also includes a membrane configured to allow vaporized coolant to pass through the membrane out of the local reservoir into an ambient environment and to prevent unvaporized coolant from passing through the membrane. The membrane is thereby configured to provide passive flow control for the liquid coolant.

In a third embodiment, a method includes receiving thermal energy from one or more heat sources at a heat sink. The method also includes passing the thermal energy from the heat sink to a liquid coolant in a local reservoir within the heat sink and vaporizing at least some of the liquid coolant. The method further includes, using a membrane, allowing vaporized coolant to pass through the membrane out of the local reservoir into an ambient environment while preventing unvaporized coolant from passing through the membrane. The membrane thereby provides passive flow control for the liquid coolant.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

Figure 1:
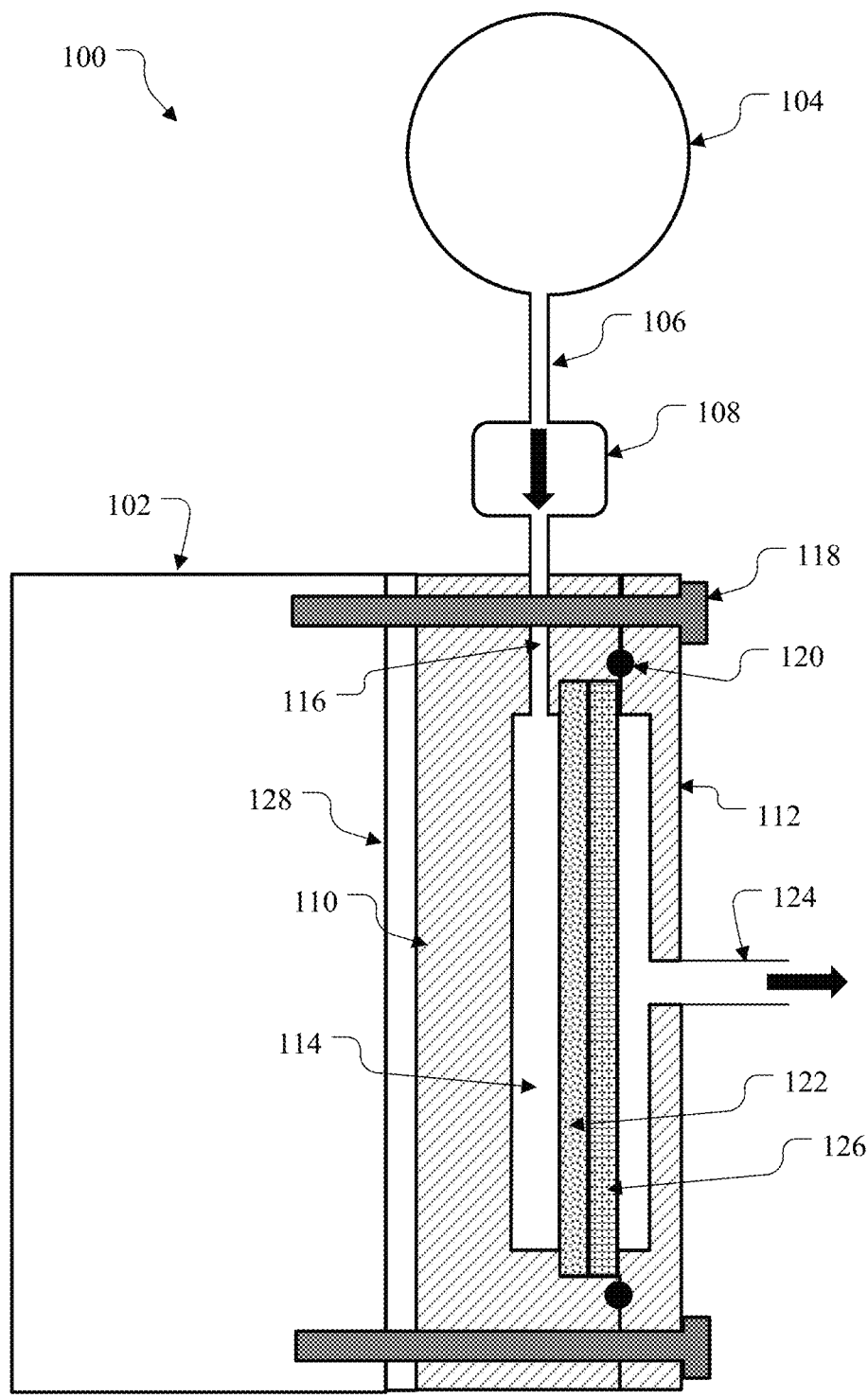
FIGS. 1 through 6 illustrate example two-phase expendable cooling systems with passive flow control membranes in accordance with this disclosure.

FIGS. 1 through 8, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

As noted above, some conventional two-phase cooling systems use liquid, such as methanol, that is converted into vapor in order to remove thermal energy from components. However, these solutions are typically effective only for short durations. Moreover, if there are multiple components to be cooled but those components do not necessarily operate at the same time, conventional systems often supply liquid to all components (which is inefficient) or use complex valves, controls, and sensors for flow control (which increases the size, weight, and cost of the systems). In addition, conventional cooling systems are often used in a variety of conditions, such as at different altitudes, which can affect the pressure and therefore the boiling point of the liquid. To compensate for this, some conventional systems use backpressure regulation in order to control the pressure of the liquid (which again increases the size, weight, and cost of the systems).

In accordance with this disclosure, various two-phase expendable or open-loop cooling systems with passive flow control membranes are described. The flow control membrane of each cooling system is vapor-permeable and is used to constrain liquid so that the liquid remains in contact with one or more heated surfaces. Each membrane has small pores (such as micro- or nano-sized pores) and only allows vapor to pass through the membrane and exit the cooling system. Thus, each membrane helps to hold the liquid in position where it can vaporize and then allows passage of the vapor into the ambient environment.

In this way, the membranes provide passive flow control without the need for complex control systems. If there are multiple surfaces to be cooled using a common supply of liquid, only the heated surface or surfaces can produce vapor, which then passes through the membrane and exits the system. Liquid is then resupplied to the heated surface or surfaces. The membranes therefore provide inherent passive control of liquid distribution for surfaces to be cooled, even where those surfaces represent heat loads having spatial or temporal variations (or may be non-existent at times). This helps to reduce or eliminate the need for complex valves, controls, and sensors for flow control. This also helps to reduce or minimize the total volume of liquid needed in a cooling system. In addition, the liquid can be easily pressurized as needed in order to maintain a favorable boiling point for the liquid. This allows the cooling systems to be less sensitive or insensitive to changes in altitude or to other changes in external ambient pressure.

FIGS. 1 through 6 illustrate example two-phase expendable cooling systems with passive flow control membranes in accordance with this disclosure. As shown in FIG. 1, a cooling system 100 includes or operates in conjunction with a heat source 102. The heat source 102 represents a structure that is to be cooled using the cooling system 100. For example, the heat source 102 could represent one or more electronic components, such as one or more processors. The heat source 102 could also represent a copper plate or other structure that receives thermal energy from one or more electronic components or other components. In general, the heat source 102 represents any suitable structure to be cooled, regardless of whether the heat source 102 generates thermal energy or receives thermal energy from one or more other components.

A cooling system reservoir 104 stores a liquid coolant to be used to cool the heat source 102. For example, the reservoir 104 could represent a structure that receives a liquid coolant, such as methanol, and that provides the coolant to other components of the cooling system 100 for use in cooling the heat source 102. The reservoir 104 could be formed from any suitable material(s), such as one or more metals or plastics. The reservoir 104 could also be formed in any suitable manner, such as injection molding, welding, machining, or additive manufacturing operations. In addition, the reservoir 104 could have any suitable size, shape, and dimensions. Ideally, the approaches described in this patent document allow the reservoir 104 to have a reduced or minimal volume while still providing adequate coolant for cooling the heat source 102. A passage 106 is fluidly coupled to the reservoir 104. The passage 106 represents any suitable structure through which coolant can flow from the cooling system reservoir 104, such as a tube or pipe.

A flow/pressure controller 108 controls at least one of the flow and the pressure of the coolant being used in the cooling system 100. For example, the flow/pressure controller 108 could control the amount of coolant exiting the reservoir 104 or the pressure of that coolant in order to ensure that the coolant used to cool the heat source 102 has an appropriate pressure (and therefore an appropriate boiling point). The flow/pressure controller 108 includes any suitable structure for controlling a flow or pressure of a coolant, such as a pump or a valve. Note that while shown as a separate component from the cooling system reservoir 104, the flow/pressure controller 108 could also be integrated into the reservoir 104. For instance, the flow/pressure controller 108 could represent a plunger within the reservoir 104 that maintains the coolant at a desired pressure. In general, a variety of approaches could be used to control the coolant exiting the reservoir 104 and to maintain adequate pressure of the coolant.

The coolant from the reservoir 104 is provided to a heat sink 110. The heat sink 110 is configured to receive thermal energy from the heat source 102 and to pass the thermal energy into the liquid coolant from the reservoir 104, which causes the coolant to vaporize. In this way, the heat sink 110 is cooled by the coolant, allowing the heat sink 110 to remove thermal energy from the heat source 102 and thereby provide cooling for the heat source 102.

The heat sink 110 has an associated cover 112, and the heat sink 110 defines an internal local reservoir 114 for receiving and holding the coolant from the reservoir 104. The cover 112 allows for access to the interior of the heat sink 110 and can be sealed against the heat sink 110, although (depending on the implementation) there may be no need for the cover 112. The local reservoir 114 receives the coolant from the reservoir 104 through an inlet port 116 of the heat sink 110.

The heat sink 110 and the cover 112 could each be formed from any suitable material(s), such as one or more metals. The heat sink 110 and the cover 112 could each also be formed in any suitable manner, such as injection molding, welding, machining, or additive manufacturing operations. In addition, the heat sink 110 and the cover 112 could each have any suitable size, shape, and dimensions. The local reservoir 114 and the inlet port 116 could each also be formed in any suitable manner and have any suitable size, shape, and dimensions.

The heat sink 110 could optionally utilize built-in heat spreading technology that allows thermal energy from the heat source 102 to be distributed more uniformly throughout the heat sink 110. For example, the heat sink 110 could be fabricated from one or more materials having a high thermal conductivity (a "high-k" value). As a particular example, the heat sink 110 could be formed from annealed pyrolytic graphite (APG). The heat sink 110 could also or alternatively include heat pipes, a vapor chamber, or other mechanism for spreading thermal energy. Further, the heat sink 110 could include one or more coatings that encourage rewetting of the heat sink's surface, such as a hydrophilic coating. In addition, the heat sink 110 could include one or more surface features that can be used to affect or optimize the local boiling of the liquid coolant, such as micro- or nano-features or a coating on the heat sink's surface.

The heat sink 110 and the cover 112 in this example can be assembled and held together using one or more connectors 118. The connectors 118 in this example represent shoulder screws or bolts, although other types of connectors could also be used. A seal 120 can be positioned between the heat sink 110 and the cover 112. The seal 120 is used to prevent undesired leakage of coolant out of the cooling system 100. The seal 120 includes any suitable structure for preventing coolant leakage, such as rubber or other O-ring material(s). Note that while the seal 120 is shown here as having a circular cross-section, the seal 120 could have any other suitable cross-sectional shape.

A flow control membrane 122 is positioned within or covers the local reservoir 114. The flow control membrane 122 allows vaporized coolant to pass through the flow control membrane 122 while preventing unvaporized coolant from passing through the flow control membrane 122. The flow control membrane 122 therefore holds the liquid coolant from the reservoir 104 in contact with at least one surface of the heat sink 110. Thermal energy from the heat source 102 travels through the heat sink 110 into the liquid coolant in the local reservoir 114 and causes at least some of the coolant to vaporize, and the vapor is allowed to escape through the flow control membrane 122. The vaporized coolant is replaced by additional coolant from the reservoir 104, allowing additional thermal energy to be removed from the heat source 102. As a result, the cooling system 100 represents a "two-phase" cooling system since liquid coolant is converted into vapor in order to remove thermal energy from the heat source 102. The vapor is allowed to escape from the cooling system 100 through an outlet port 124 of the cover 112. The outlet port 124 can vent the vapor into an ambient environment, which means the cooling system 100 represents an "expendable" or "open-loop" cooling system since the vapor is not retained in the system 100.

The flow control membrane 122 includes any suitable structure that allows vapor passage and prevents or restricts liquid passage. For example, the flow control membrane 122 could represent any suitable vapor-permeable, liquid-repelling membrane, such as a hydrophobic or oleophobic membrane. The flow control membrane 122 typically has small pores that allow passage of vapor while restricting passage of liquid. The size of the pores and the overall thickness of the membrane 122 can be selected to provide the desired functioning of the flow control membrane 122. For instance, the pressure drop between the coolant in the local reservoir 114 and the ambient environment occurs mostly across the flow control membrane 122, and the pressure drop should be sufficient to force vapor out of the local reservoir 114 while remaining below the liquid breakthrough pressure of the membrane 122. The pore size and the membrane thickness can be selected in order to provide the desired vapor flow through the membrane 122. The flow control membrane 122 could optionally include one or more coatings that encourage vapor to attach to the flow control membrane, such as a hydrophobic coating.

The flow control membrane 122 could be formed from any suitable material(s), such as polytetrafluoroethylene (PTFE), polyvinylidene fluoride (PVDF), or other low surface energy material(s). The flow control membrane 122 could also be formed in any suitable manner. In addition, the flow control membrane 122 could have any suitable size, shape, and dimensions. The flow control membrane 122 here could be bonded, sealed, or otherwise attached to the heat sink 110, or a separate seal could be positioned between the flow control membrane 122 and the heat sink 110 to prevent the flow of coolant around the membrane 122. The outlet port 124 of the cover 112 could be formed in any suitable manner and have any suitable size, shape, and dimensions.

If needed or desired, a membrane support 126 can be used to maintain the position of the flow control membrane 122 and to prevent the membrane 122 from being pushed away from the heat sink 110 due to pressure in the local reservoir 114. If used, the membrane support 126 would include openings that allow the vapor passing through the flow control membrane 122 to also pass through the membrane support 126 and reach the outlet port 124. The membrane support 126 could be formed from any suitable material(s), such as one or more metals or plastics. The membrane support 126 could also be formed in any suitable manner and have any suitable size, shape, and dimensions. The membrane support 126 (in addition to or instead of the flow control membrane 122) could be bonded, sealed, or otherwise attached to the heat sink 110, or a separate seal could be positioned between the membrane support 126 and the heat sink 110 or the cover 112 to prevent the flow of coolant around the membrane 122 and the membrane support 126.

Optionally, a thermal interface material 128 can be placed between the heat source 102 and the heat sink 110 to enhance the thermal coupling of the heat source 102 and the heat sink 110. For example, the thermal interface material 128 could be used to increase the transfer of thermal energy from the heat source 102 into the heat sink 110 (compared to thermal energy transfer without the thermal interface material 128). The thermal interface material 128 could also be patterned in order to provide selective areas where the transfer of thermal energy from the heat source 102 into the heat sink 110 is improved. This could help to improve the removal of thermal energy from a heat source 102 that has a spatially or temporally uneven heat generation pattern. The thermal interface material 128 could include any suitable material that improves thermal energy transfer.

As noted above, liquid coolant from the cooling system reservoir 104 passes into the local reservoir 114 of the heat sink 110, and the flow control membrane 122 maintains the liquid coolant in contact with the surface(s) of the heat sink 110. Thermal energy from the heat source 102 causes at least some of the liquid coolant to vaporize, and the vapor is allowed to pass through the flow control membrane 122 out into the ambient environment through the outlet port 124. Additional liquid coolant from the reservoir 104 replaces the vaporized coolant in the local reservoir 114 of the heat sink 110, allowing additional thermal energy to be removed from the heat source 102. The flow control membrane 122 thereby enables vapor ejection while passively (without a regulator) preventing unvaporized coolant from passing through the membrane 122 over varying pressure differences (such as those attributed to operation at different altitudes).

Figure 2:
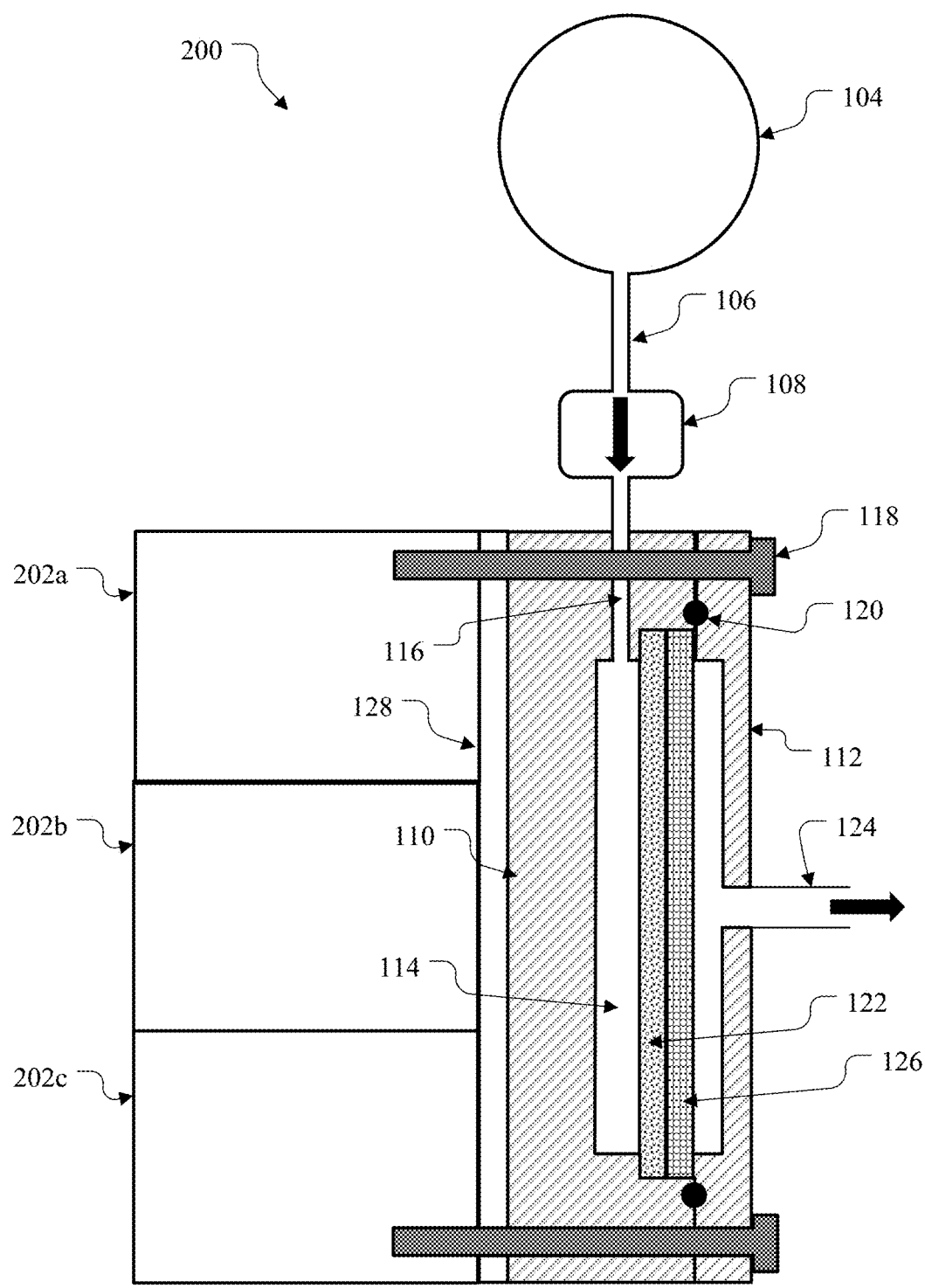

A number of potential modifications could be made to the design shown in FIG. 1 while still obtaining the benefits described in this patent document. For example, FIG. 2 illustrates an example cooling system 200 in which elements 104-128 can be the same as or similar to those discussed above. However, in FIG. 2, the cooling system 200 includes or operates in conjunction with multiple heat sources 202a-202c. Each of the heat sources 202a-202c represents any suitable structure to be cooled, regardless of whether that heat source 202a-202c generates thermal energy or receives thermal energy from other component(s). Note that while three heat sources are shown here, the cooling system 200 could include or operate in conjunction with any number of heat sources.

The heat sources 202a-202c may represent heat loads that vary spatially or temporally. Spatial variations can be caused when two or more heat sources 202a-202c generate different amounts of thermal energy at the same time. Temporal variations can be caused when one or more heat sources 202a-202c generate different amounts of thermal energy at different times. A combination of spatial and temporal variations could also exist with the heat sources 202a-202c.

The passive regulation provided by the flow control membrane 122 allows liquid coolant from the reservoir 104 to be provided to the local reservoir 114 as needed. For example, one or more heat sources 202a-202c that may be producing more thermal energy could produce more vapor, which travels through the flow control membrane 122 and exits through the outlet port 124, and the vaporized coolant is replaced with additional liquid coolant. One or more heat sources 202a-202c that may be producing less or no thermal energy could generate less or no vapor. If thermal energy generation by the heat sources 202a-202c changes, the vaporization and replacement of the coolant in the local reservoir 114 can compensate for the varying heat loads. Note that the differences in thermal energy generation may not be visible from the perspective of the local reservoir 114 if the heat sink 110 adequately spreads the thermal energy throughout the heat sink 110. Even if the spatial or temporal variations of the thermal energy generation is visible from the perspective of the local reservoir 114, this could merely mean that certain portions of the heat sink 110 transfer more thermal energy than other portions into the liquid coolant. The vaporized coolant in the local reservoir 114 can still be easily replaced as needed.

As noted above, the thermal interface material 128 could be patterned in order to provide selective areas where the transfer of thermal energy into the heat sink 110 is improved. In FIG. 2, this could optionally be done for certain heat sources 202a-202c or for certain portions of the heat sources 202a-202c.

Figure 3:
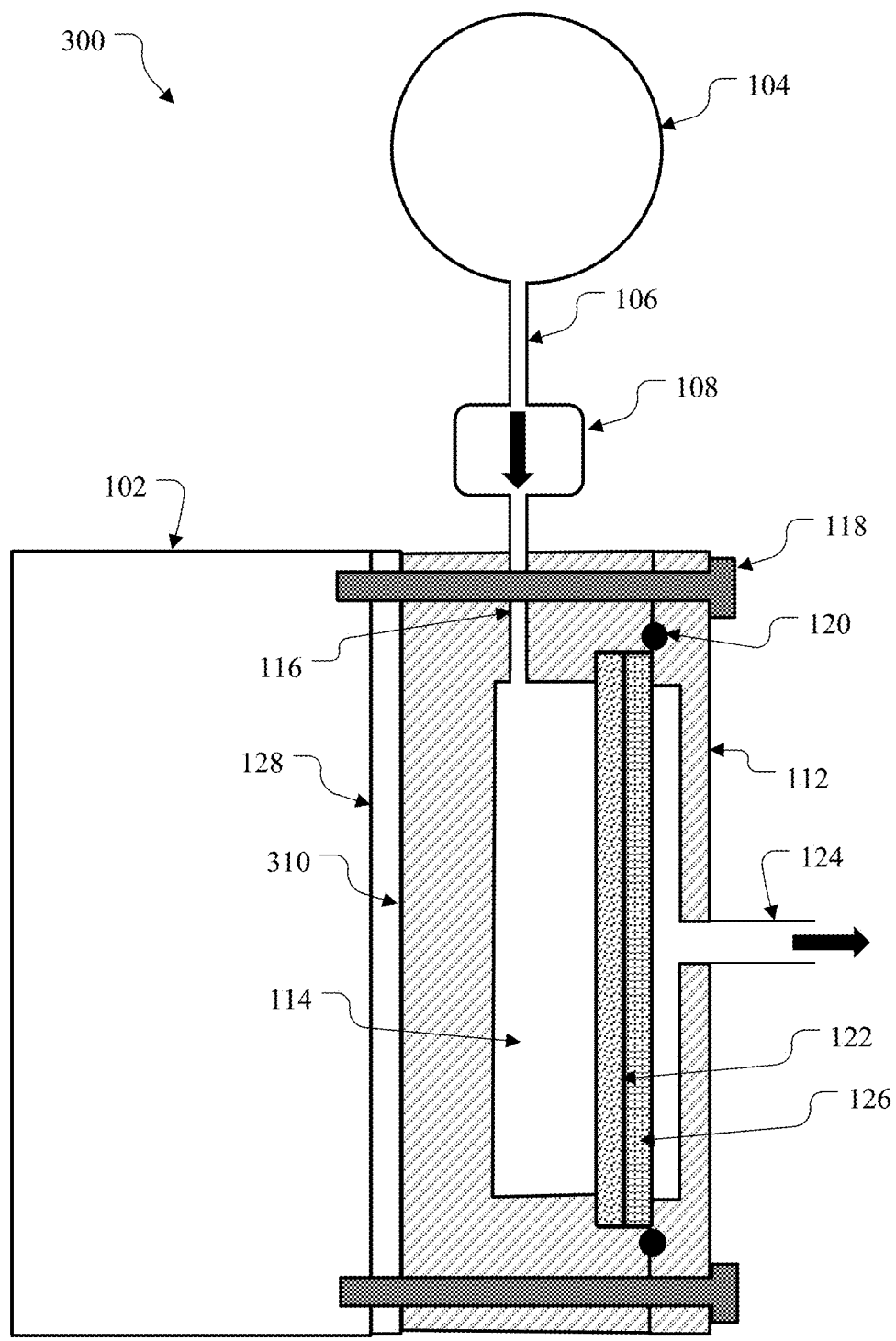

FIG. 3 illustrates an example cooling system 300 in which elements 104-108 and 112-128 can be the same as or similar to those discussed above. While a single heat source 102 is shown in FIG. 3, multiple heat sources could also be used. In FIG. 3, the cooling system 300 includes a heat sink 310 that provides a larger standoff distance between the heat source(s) and the flow control membrane 122 (compared to the standoff distance in FIGS. 1 and 2). As a result, more liquid coolant from the reservoir 104 can move into the local reservoir 114 and be used to remove thermal energy from the heat source(s).

Note that it is possible to vary the standoff distance between the heat source(s) and the flow control membrane 122 in various ways. In FIGS. 1 through 3, the standoff distance is altered by using different heat sinks 110 and 310 of different sizes. However, other approaches could also be used to vary the standoff distance between the heat source(s) and the flow control membrane 122. For example, a heat sink could be fabricated using multiple parts, such as one part that contacts the heat source(s) and another part that contacts the flow control membrane 122. Seals of different sizes could then be inserted between the multiple parts of the heat sink in order to vary the standoff distance between the heat source(s) and the flow control membrane 122. As another example, a heat sink could include a telescopic assembly or other assembly that allows modification of the distance between an inner major surface of the heat sink and the flow control membrane 122. Any other suitable approach could be used to allow variations in the standoff distance between the heat source(s) and the flow control membrane 122.

Figure 4:
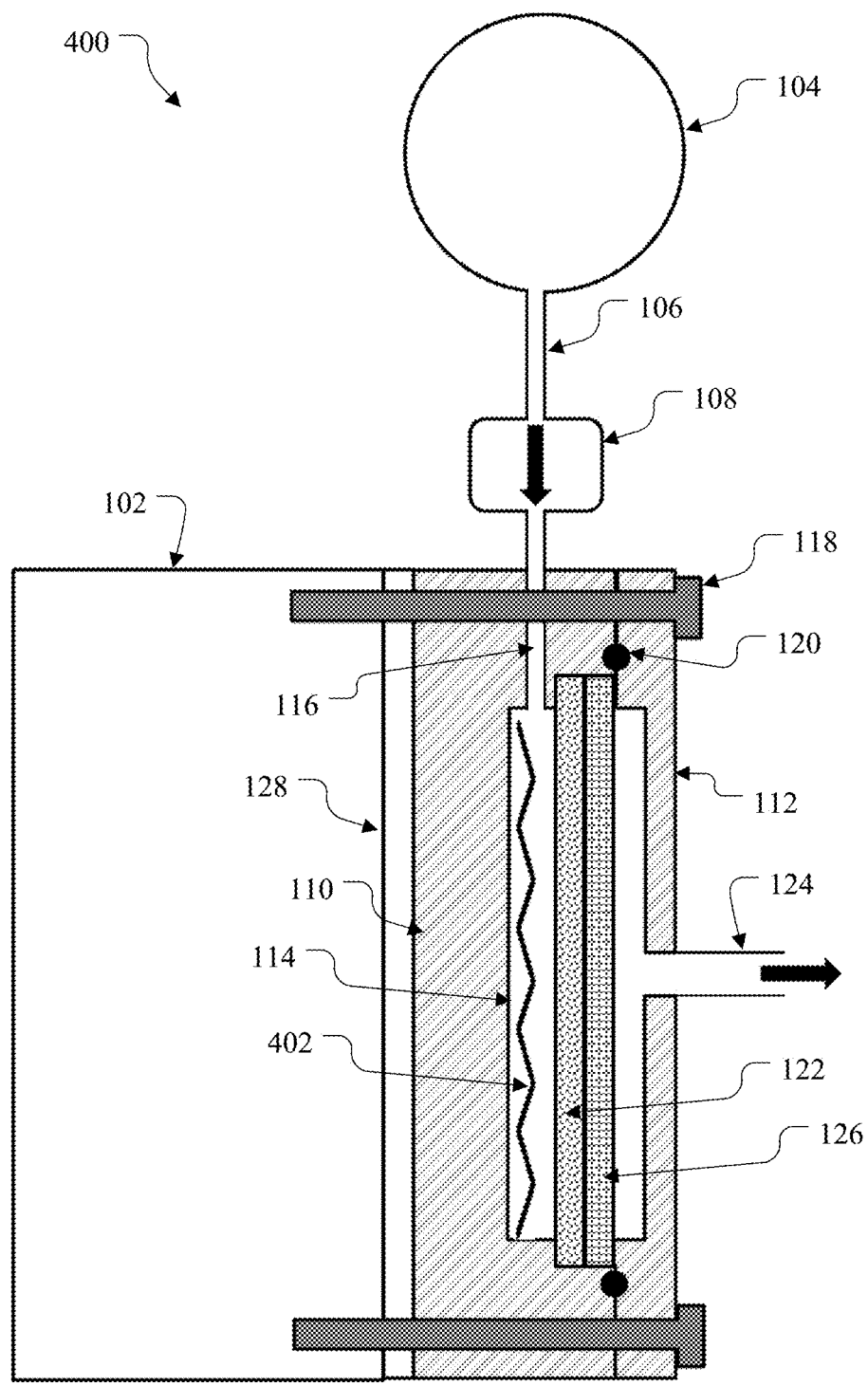

FIG. 4 illustrates an example cooling system 400 in which elements 104-128 can be the same as or similar to those discussed above. While a single heat source 102 is shown in FIG. 4, multiple heat sources could also be used. In FIG. 4, the cooling system 400 additionally includes one or more surface features 402 in at least one of a surface of the heat sink 110 and a surface of the flow control membrane 122. The surface features 402 could represent structures that increase the surface area of the heat sink 110 and/or the flow control membrane 122 that contacts the coolant in the local reservoir 114 (compared to planar surfaces without the surface features). The surface features 402 can help to increase the absorption of thermal energy by liquid coolant from the surface of the heat sink 110 or to increase the passage of vaporized coolant through the flow control membrane 122. The surface features 402 could also or alternatively represent structures that affect or optimize the local boiling of liquid coolant.

Various types of surface features 402 could be used in the surface of the heat sink 110 or in the surface of the flow control membrane 122. For example, a textured or other non-uniform (non-planar) surface can increase the surface area of the heat sink 110 or the flow control membrane 122. As another example, T-shaped fins or fins of other shapes could project from the surface of the heat sink 110 towards the flow control membrane 122 and/or from the surface of the flow control membrane 122 towards the heat sink 110. The surface features 402 could form wicking structures into the coolant to assist in vapor removal from the local reservoir 114. The surface features 402 could represent micro- or nano-features, coatings, or other structures that affect the boiling of liquid coolant. Any other or additional surface features could be used here. Instead of or in addition surface features, the flow control membrane 122 itself could also be folded or placed into a non-planer configuration in order to increase the surface area of the membrane 122 that contacts the coolant.

Figure 5:
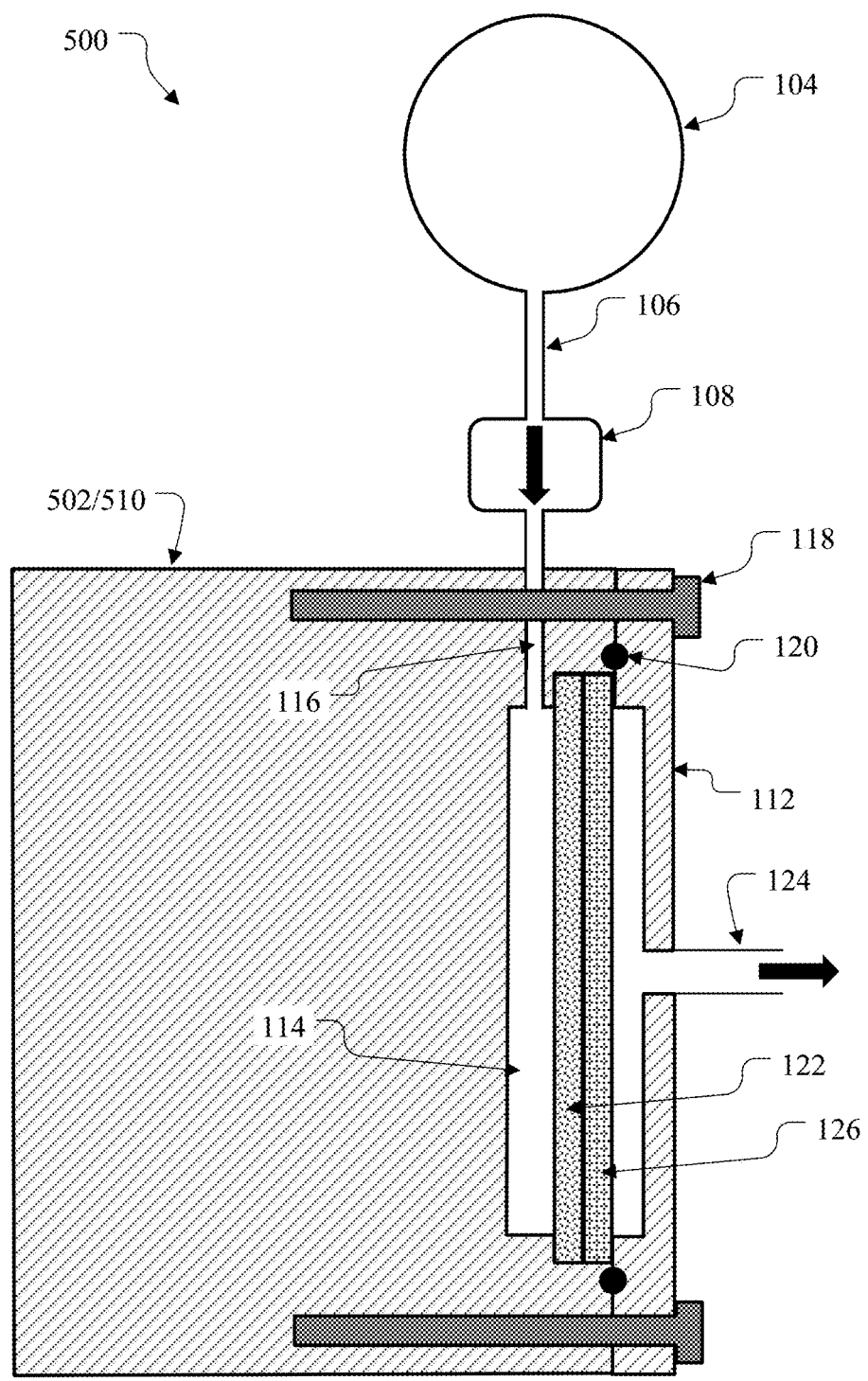

FIG. 5 illustrates an example cooling system 500 in which elements 104-108 and 112-128 can be the same as or similar to those discussed above. The cooling system 500 also includes at least one heat source 502 and a heat sink 510 that are integrated into a single structure. The integrated structure can both (i) generate or receive thermal energy and (ii) transfer the thermal energy into liquid coolant in the local reservoir 114. This type of arrangement can help to reduce the temperature difference between the heat source(s) 502 and the heat sink 510.

Figure 6:
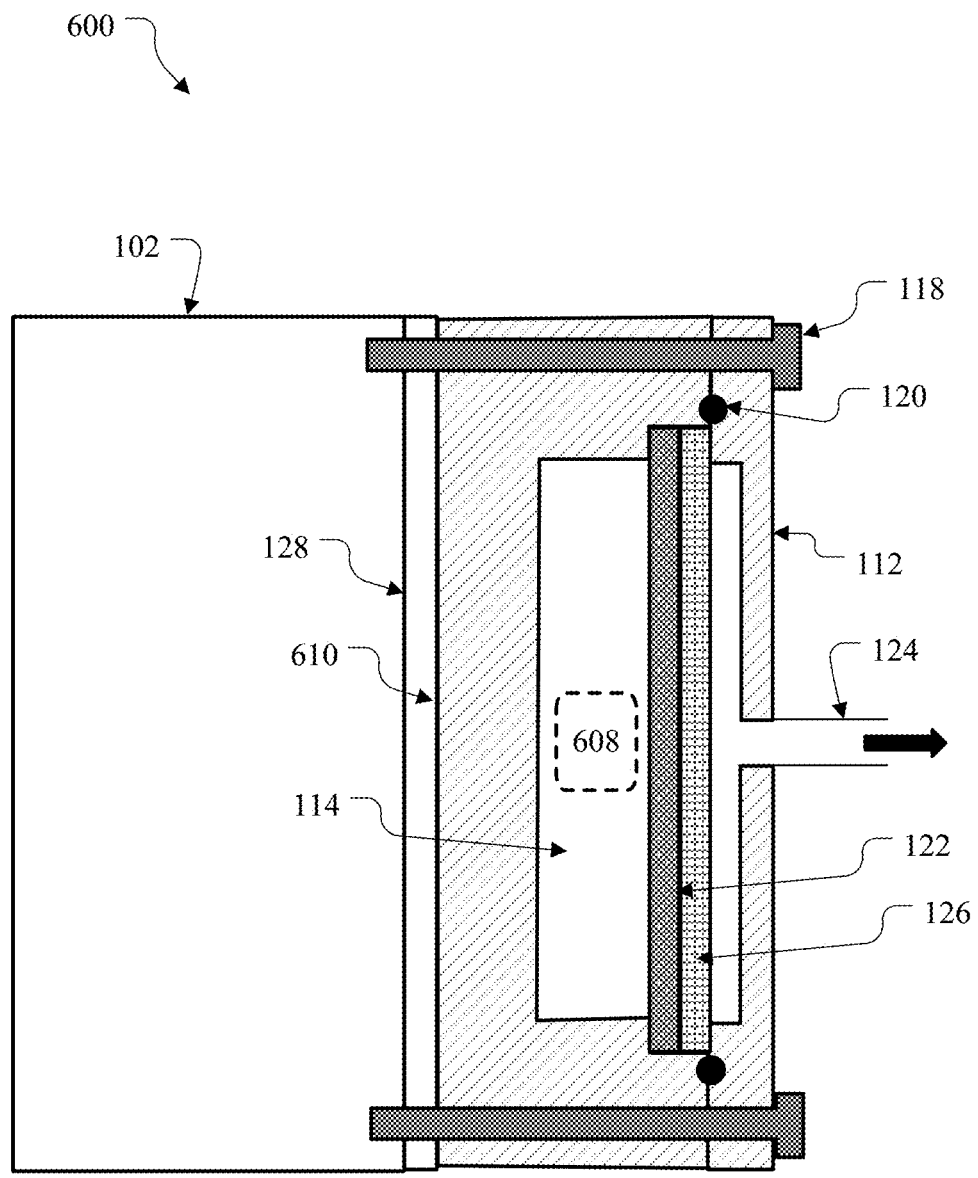

FIG. 6 illustrates an example cooling system 600 in which elements 112-114 and 118-128 can be the same as or similar to those discussed above. While a single heat source 102 is shown in FIG. 6, multiple heat sources could also be used. In FIG. 6, a heat sink 610 defines an internal local reservoir 114 for receiving and holding a liquid coolant, but the liquid coolant is stored in the local reservoir 114 only and is not received from a cooling system reservoir 104. Thus, the only liquid coolant is contained in the local reservoir 114, and any vaporized coolant can be replaced by other liquid coolant contained in the local reservoir 114. In some embodiments, the local reservoir 114 could be refilled as needed (assuming the cooling system 600 is not a one-time use system). Note that the local reservoir 114 here could have any suitable size, shape, and dimensions in order to store the desired amount of liquid coolant.

Optionally, a flow/pressure controller 608 could be used within the local reservoir 114. The flow/pressure controller 608 can operate to adjust or control the flow or pressure of liquid coolant within the local reservoir 114. The flow/pressure controller 608 includes any suitable structure for controlling a flow or pressure of a coolant. For example, the flow/pressure controller 608 could represent a plunger within the local reservoir 114 that forces the liquid coolant out of a specified area of the local reservoir 114 to increase or maintain the pressure in other areas of the local reservoir 114. Note, however, that the use of the flow/pressure controller 608 is not required in the cooling system 600. For instance, when cooling is needed only for short durations, the cooling system 600 could use no flow or pressure control.

Although FIGS. 1 through 6 illustrate examples of two-phase expendable cooling systems with passive flow control membranes, various changes may be made to FIGS. 1 through 6. For example, while FIGS. 1 through 6 illustrate cooling systems with different features, any feature or features shown in one or more of these figures could be used in the other figures. As a particular example, any of the cooling systems in FIGS. 1 through 5 could use an internal reservoir 114 for coolant and lack a cooling system reservoir 104 as is done in FIG. 6. Also, while FIGS. 1 through 6 illustrate cross-sections of example cooling systems, the cooling systems could have any suitable overall three-dimensional shapes. For instance, the cooling systems could be fabricated with a circular geometry, a rectangular or square geometry, or other suitable regular or irregular shape. Further, FIGS. 1 through 6 are not drawn to scale, and features of the structures in FIGS. 1 through 6 have been exaggerated to facilitate an understanding of this disclosure. As a particular example, the size of the local reservoir 114 could have a wide range of values depending on the implementation, so the size of the local reservoir 114 could be much larger or smaller than what is depicted here.

There are various ways in which a cooling system with a passive flow control membrane can be designed to operate. For example, the intended application of a cooling system can be identified. The cooling system can then be designed so that the pressure in the cooling system reservoir 104 will provide adequate coolant to the local reservoir 114 during operation in the intended application or so that the local reservoir 114 has a suitable pressure during operation in the intended application. In other embodiments, active control logic can be used with the cooling system in order to adjust the pressure in the cooling system reservoir 104 or in the local reservoir 114.

Figure 7:
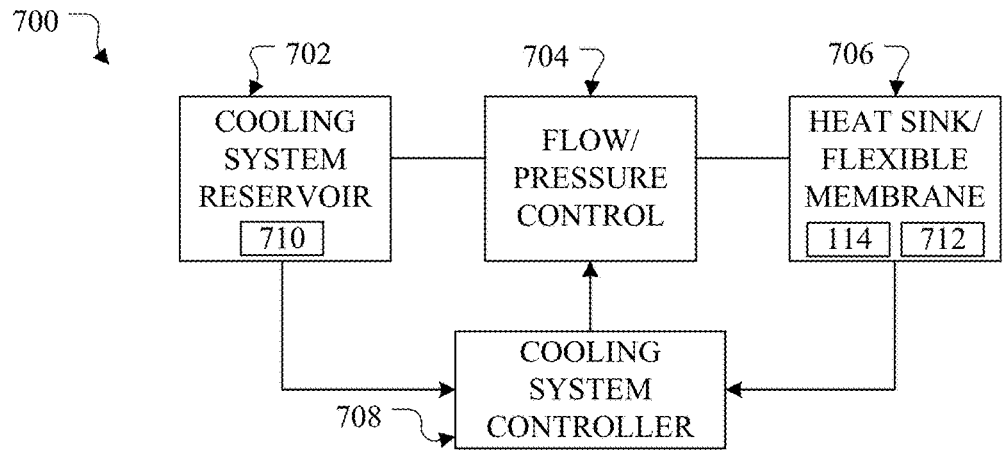
FIG. 7 illustrates an example system having a two-phase expendable cooling system with a passive flow control membrane in accordance with this disclosure.

FIG. 7 illustrates an example system 700 having a two-phase expendable cooling system with a passive flow control membrane in accordance with this disclosure. As shown in FIG. 7, the cooling system here is implemented using a cooling system reservoir 702, a flow/pressure controller 704, and a heat sink/flexible membrane 706. These components could be the same as or similar to corresponding components in any of the cooling systems 100-600 discussed above. However, the use of a cooling system reservoir 702 and a flow/pressure controller 704 external to the heat sink/flexible membrane 706 may not be needed if only an internal local reservoir 114 is used in the heat sink/flexible membrane 706. Other components of the cooling systems discussed above are omitted here for clarity.

The system 700 also includes a cooling system controller 708, which is configured to receive inputs from one or more sensors 710-712 and to adjust the flow/pressure controller 704 or other component(s) of a cooling system. For example, the cooling system controller 708 could receive pressure measurements identifying the pressure in the reservoir 702 and/or the pressure in the local reservoir 114 that is defined within the heat sink/flexible membrane 706. Based on these pressure measurements, the cooling system controller 708 could adjust the flow/pressure controller 704 to change the amount of coolant entering the local reservoir 114 or to change the pressure within the reservoir 702 or the local reservoir 114. The cooling system controller 708 could use any other or additional measurements to make adjustments to the cooling system. The cooling system controller 708 could also use one or more other actuators instead of or in addition to the flow/pressure controller 704. In this way, it is possible to use one or more control loops to control the operation of a cooling system in order to adjust the local pressure (and the desired boiling point) of an expendable coolant.

The cooling system controller 708 includes any suitable structure for controlling at least part of a cooling system having a passive flow control membrane. For example, the cooling system controller 708 could include one or more microprocessors, microcontrollers, digital signal processors, field programmable gate arrays, application specific integrated circuits, or discrete circuitry. The cooling system controller 708 could also execute software or firmware instructions to provide the desired control functionality. Each sensor 710 and 712 represents any suitable structure for measuring pressure or other characteristic(s) of at least part of a cooling system. Note that the numbers and locations of the sensors 710 and 712 in FIG. 7 are for illustration only and that any number of sensors could be used in any number of locations in the system 700.

Although FIG. 7 illustrates one example of a system 700 having a two-phase expendable cooling system with a passive flow control membrane, various changes may be made to FIG. 7. For example, the system 700 could include any number of cooling system reservoirs, flow/pressure controllers, heat sinks/flexible membranes, and cooling system controllers. Also, a two-phase expendable cooling system with a passive flow control membrane could be used in any other suitable manner.

Figure 8:
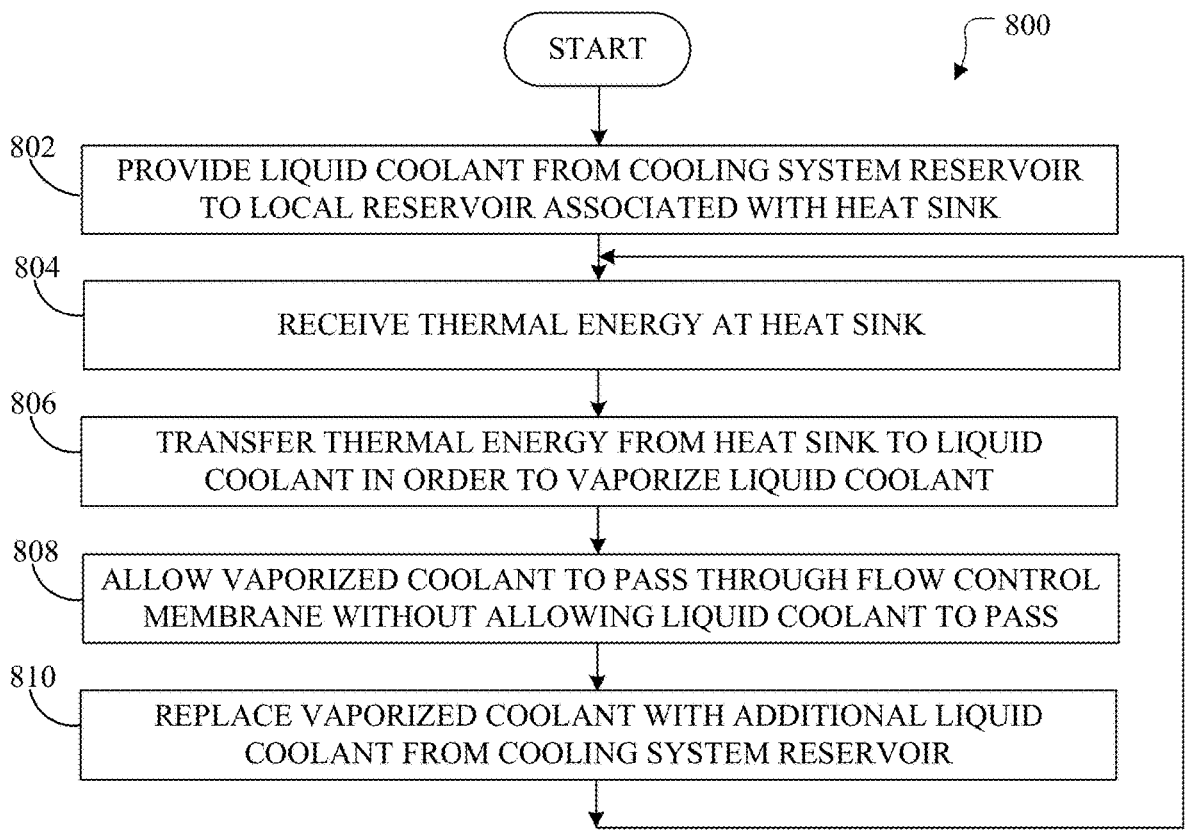
FIG. 8 illustrates an example method for cooling using a two-phase expendable cooling system with a passive flow control membrane in accordance with this disclosure.

FIG. 8 illustrates an example method 800 for cooling using a two-phase expendable cooling system with a passive flow control membrane in accordance with this disclosure. For ease of explanation, the method 800 is described as involving the use of the cooling systems 100-600 in FIGS. 1 through 6. However, the method 800 could be used with any other suitable cooling systems.

As shown in FIG. 8, liquid coolant is provided from a cooling system reservoir to a local reservoir associated with a heat sink at step 802. This could include, for example, liquid coolant exiting a cooling system reservoir 104 and traveling through a passage 106 into a local reservoir 114 defined by a heat sink 110, 310, 510. A flow/pressure controller 108 can be used to control the flow of the liquid coolant out of the reservoir 104 and into the local reservoir 114. As noted above, however, this step is optional since the cooling system reservoir need not be used.

Thermal energy is received at the heat sink at step 804. This could include, for example, one or more heat sources 102, 202a-202c, 502 generating thermal energy or receiving thermal energy from other components. This could also include the heat sink 110, 310, 510, 610 receiving the thermal energy from the one or more heat sources 102, 202a-202c, 502. As a particular example, this could include the heat sink 110, 310, 510, 610 receiving thermal energy from one or more processors or other electronic components. As noted above, the thermal energy received by the heat sink 110, 310, 510, 610 need not be consistent and could vary spatially or temporally.

The thermal energy is transferred from the heat sink to the liquid coolant in the local reservoir in order to vaporize at least some of the liquid coolant at step 806. This could include, for example, the heat sink 110, 310, 510, 610 providing the thermal energy to the liquid coolant in the local reservoir 114 that is contacting the heat sink. This causes at least some of the liquid coolant to vaporize, which removes thermal energy from the heat sink 110, 310, 510, 610 and transfers the thermal energy into the vapor. The vapor is allowed to pass through a flow control membrane without allowing the liquid coolant to pass through the flow control membrane at step 808. This could include, for example, the generated vapor passing through pores of the flow control membrane 122 that are too small for the liquid coolant. This could also include the vapor passing through the flow control membrane 122 into the ambient atmosphere around the cooling system.

The vaporized coolant in the local reservoir is replaced with additional liquid coolant from the cooling system reservoir at step 810. This could include, for example, additional liquid coolant exiting the reservoir 104 and traveling through the passage 106 to the local reservoir 114 or additional liquid coolant in the local reservoir 114 replacing the vaporized coolant. The flow/pressure controller 108 can again be used to control the flow of the liquid coolant out of the reservoir 104 and into the local reservoir 114, although again the use of the reservoir 104 is optional. The additional liquid coolant can then be used to remove additional thermal energy from the heat sink 110, 310, 510, 610.

During this process, the flow control membrane 122 provides passive flow control, allowing vapor to exit the cooling system while retaining liquid coolant against one or more surfaces of a heat sink. Moreover, a common supply of liquid coolant can be used to cool multiple heat sources, including heat sources that create spatially or temporally varying heat loads. In addition, the liquid coolant being used can be pressurized in order to maintain a desirable boiling point for the liquid coolant in the cooling system, allowing the cooling system to operate over various altitudes or other external ambient pressures.

Although FIG. 8 illustrates an example method 800 for cooling using a two-phase expendable cooling system with a passive flow control membrane, various changes may be made to FIG. 8. For example, while shown as a series of steps, various steps in FIG. 8 could overlap, occur in parallel, occur in a different order, or occur any number of times.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the scope of this disclosure, as defined by the following claims.

What is claimed is:

1. An apparatus comprising:
    a heat sink configured to receive thermal energy from one or more heat sources, the heat sink comprising a local reservoir configured to hold a liquid coolant, the heat sink configured to pass the thermal energy into the liquid coolant in the local reservoir in order to vaporize at least some of the liquid coolant;
    a pressure controller located within the local reservoir and configured to control a pressure within the local reservoir, wherein the pressure controller comprises a plunger configured to reduce a total area of the local reservoir by forcing the liquid coolant out of a specified area of the local reservoir to increase pressure in at least one other area of the local reservoir;
    a membrane configured to allow vaporized coolant to pass through the membrane out of the local reservoir into an ambient environment and to prevent unvaporized coolant from passing through the membrane, the membrane thereby configured to provide passive flow control for the liquid coolant, wherein the membrane includes surface features that extend from the membrane into the local reservoir to assist in vapor removal from the local reservoir; and
    a membrane support configured to maintain a position of the membrane and to prevent the membrane from being pushed away from the heat sink due to the pressure in the local reservoir.

2. The apparatus of claim 1, wherein the membrane is further configured to hold the liquid coolant in the local reservoir against one or more surfaces of the heat sink.

3. The apparatus of claim 1, further comprising:
    a cover coupled to the heat sink, the cover comprising an outlet port through which the vaporized coolant passes into the ambient environment;
    a seal positioned between the heat sink and the cover, the seal configured to prevent leakage of the liquid coolant out of the local reservoir; and
    a connector passing through the cover and the heat sink, the connector holding the seal between the cover and the heat sink.

4. The apparatus of claim 1, further comprising:
    a thermal interface material on the heat sink, the thermal interface material configured to transfer thermal energy from the one or more heat sources into the heat sink;
    wherein the thermal interface material has a higher heat transfer coefficient than the heat sink; and
    wherein the thermal interface material is patterned to provide focused heat transfer from selective areas of a spatially or temporally uneven heat generation pattern of the one or more heat sources.

5. The apparatus of claim 1, wherein the heat sink is integral with the one or more heat sources.

6. The apparatus of claim 1, wherein at least one of:
    the heat sink has surface features that at least one of: increase a surface area of the heat sink in contact with the liquid coolant, increase rewetting of the heat sink, and affect local boiling of the liquid coolant; and
    the membrane has additional surface features that at least one of: increase a surface area through which the vaporized coolant is able to pass, and encourage the vaporized coolant to attach to the membrane.

7. A system comprising:
one or more heat sources configured to generate or receive thermal energy; and
a cooling system comprising:
- a heat sink configured to receive the thermal energy from the one or more heat sources, the heat sink comprising a local reservoir configured to hold a liquid coolant, the heat sink configured to pass the thermal energy into the liquid coolant in the local reservoir in order to vaporize at least some of the liquid coolant;
- an internal pressure controller located within the local reservoir and configured to control a pressure within the local reservoir, wherein the internal pressure controller comprises a plunger configured to reduce a total area of the local reservoir by forcing the liquid coolant out of a specified area of the local reservoir to increase pressure in at least one other area of the local reservoir;
- a membrane configured to allow vaporized coolant to pass through the membrane out of the local reservoir into an ambient environment and to prevent unvaporized coolant from passing through the membrane, the membrane thereby configured to provide passive flow control for the liquid coolant, wherein the membrane includes surface features that extend from the membrane into the local reservoir to assist in vapor removal from the local reservoir; and
- a membrane support configured to maintain a position of the membrane and to prevent the membrane from being pushed away from the heat sink due to the pressure in the local reservoir.

8. The system of claim 7, further comprising:
a cooling system reservoir configured to store the liquid coolant; and
an external flow/pressure controller configured to control a flow or pressure of the liquid coolant into the local reservoir.

9. The system of claim 8, further comprising:
one or more sensors configured to measure at least one characteristic associated with the cooling system; and
a cooling system controller configured to control the external flow/pressure controller based on measurements of the at least one characteristic.

10. The system of claim 7, wherein the membrane is further configured to hold the liquid coolant in the local reservoir against one or more surfaces of the heat sink.

11. The system of claim 7, wherein:
the cooling system further comprises a cooling system reservoir configured to store the liquid coolant; and
the heat sink further comprises an inlet port configured to be coupled to the cooling system reservoir and to receive the liquid coolant from the cooling system reservoir.

12. The system of claim 7, wherein the cooling system further comprises:
a thermal interface material on the heat sink, the thermal interface material configured to transfer thermal energy from the one or more heat sources into the heat sink;
wherein the thermal interface material has a higher heat transfer coefficient than the heat sink; and
wherein the thermal interface material is patterned to provide focused heat transfer from selective areas of a spatially or temporally uneven heat generation pattern of the one or more heat sources.

13. The system of claim 7, wherein the heat sink is integral with the one or more heat sources.

14. The system of claim 7, wherein at least one of:
the heat sink has surface features that at least one of: increase a surface area of the heat sink in contact with the liquid coolant, increase rewetting of the heat sink, and affect local boiling of the liquid coolant; and
the membrane has additional surface features that at least one of: increase a surface area through which the vaporized coolant is able to pass, and encourage the vaporized coolant to attach to the membrane.

15. The system of claim 7, wherein the cooling system further includes:
a cover coupled to the heat sink, the cover comprising an outlet port through which the vaporized coolant passes into the ambient environment;
a seal positioned between the heat sink and the cover, the seal configured to prevent leakage of the liquid coolant out of the local reservoir; and
a connector passing through the cover and the heat sink, the connector holding the seal between the cover and the heat sink.

16. A method comprising:
receiving thermal energy from one or more heat sources at a heat sink;
passing the thermal energy from the heat sink to a liquid coolant in a local reservoir within the heat sink and vaporizing at least some of the liquid coolant;
controlling a pressure of the local reservoir using a pressure controller located within the local reservoir, wherein the pressure controller comprises a plunger configured to reduce a total area of the local reservoir by forcing the liquid coolant out of a specified area of the local reservoir to increase pressure in at least one other area of the local reservoir;
using a membrane, allowing vaporized coolant to pass through the membrane out of the local reservoir into an ambient environment while preventing unvaporized coolant from passing through the membrane, the membrane thereby providing passive flow control for the liquid coolant, wherein the membrane includes surface features that extend from the membrane into the local reservoir to assist in vapor removal from the local reservoir; and
using a membrane support, maintaining a position of the membrane and preventing the membrane from being pushed away from the heat sink due to the pressure in the local reservoir.

17. The method of claim 16, wherein the membrane holds the liquid coolant in the local reservoir against one or more surfaces of the heat sink.

18. The method of claim 16, wherein the vaporized coolant passes into the ambient environment through a cover coupled to the heat sink, the cover comprising an outlet port.

19. The method of claim 16, further comprising:
using a thermal interface material on the heat sink to transfer thermal energy from the one or more heat sources into the heat sink;
wherein the thermal interface material has a higher heat transfer coefficient than the heat sink; and
wherein the thermal interface material is patterned to provide focused heat transfer from selective areas of a spatially or temporally uneven heat generation pattern of the one or more heat sources.

20. The method of claim 16, wherein at least one of:
the heat sink has surface features that at least one of: increase a surface area of the heat sink in contact with the liquid coolant, increase rewetting of the heat sink, and affect local boiling of the liquid coolant; and the membrane has additional surface features that at least one of: increase a surface area through which the vaporized coolant is able to pass, and encourage the vaporized coolant to attach to the membrane.

* * * * *